(12) United States Patent
Baek et al.

(10) Patent No.: US 8,875,657 B2
(45) Date of Patent: Nov. 4, 2014

(54) BALANCING RF BRIDGE ASSEMBLY

(75) Inventors: Jonghoon Baek, San Jose, CA (US);
Sam H. Kim, San Ramon, CA (US);
Beom Soo Park, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 954 days.

(21) Appl. No.: 13/014,113

(22) Filed: Jan. 26, 2011

(65) Prior Publication Data

US 2011/0185972 A1 Aug. 4, 2011

Related U.S. Application Data

(60) Provisional application No. 61/298,394, filed on Jan. 26, 2010.

(51) Int. Cl.
*C23C 16/00* (2006.01)
*C23F 1/00* (2006.01)
*H01L 21/306* (2006.01)
*C23C 16/505* (2006.01)

(52) U.S. Cl.
CPC .................................... *C23C 16/505* (2013.01)
USPC .................. 118/723 E; 156/345.44

(58) Field of Classification Search
CPC .. C23C 16/455; C23C 16/505; C23C 16/515; C23C 26/00; C23C 4/125; C23C 4/127; C23C 8/10; C23C 8/36; H01L 21/76861; H01L 22/02; H01L 22/26; H01L 23/02; H01L 23/29; H01L 23/293; H01L 23/3171; H01L 28/40; H01L 29/66568; H01L 31/036; H01L 31/0368; H01L 31/077; H01L 31/1884; H01L 31/20
USPC .................. 118/723 R, 715, 722, 723 E; 156/345.43–345.47; 315/111.21
See application file for complete search history.

(56) References Cited

U.S. PATENT DOCUMENTS

| | | | |
|---|---|---|---|
| 6,042,686 A * | 3/2000 | Dible et al. | ............... 156/345.44 |
| 6,359,250 B1 | 3/2002 | Blonigan et al. | |
| 2002/0125223 A1 | 9/2002 | Johnson et al. | |
| 2007/0051388 A1 | 3/2007 | Sorensen | |
| 2009/0022905 A1 | 1/2009 | Kudela et al. | |
| 2009/0101069 A1 | 4/2009 | Anwar et al. | |
| 2009/0159423 A1* | 6/2009 | Kudela et al. | ............ 204/157.44 |
| 2010/0009096 A1* | 1/2010 | Kawamura et al. | ........... 427/569 |
| 2010/0206483 A1 | 8/2010 | Sorensen et al. | |

FOREIGN PATENT DOCUMENTS

JP 2001267098 * 9/2001

OTHER PUBLICATIONS

International Search Report and Written Opinion for PCT/US2011/022577 dated Aug. 24, 2011.

* cited by examiner

*Primary Examiner* — Maureen Gramaglia
(74) *Attorney, Agent, or Firm* — Patterson & Sheridan, LLP

(57) ABSTRACT

Embodiments disclosed herein generally relate to a PECVD apparatus. When the RF power source is coupled to the electrode at multiple locations, the current and voltage may be different at the multiple locations. In order to ensure that both the current and voltage are substantially identical at the multiple locations, an RF bridge assembly may be coupled between the multiple locations at a location just before connection to the electrode. The RF bridge assembly substantially equalizes the voltage distribution and current distribution between multiple locations. Therefore, a substantially identical current and voltage is applied to the electrode at the multiple locations.

17 Claims, 6 Drawing Sheets

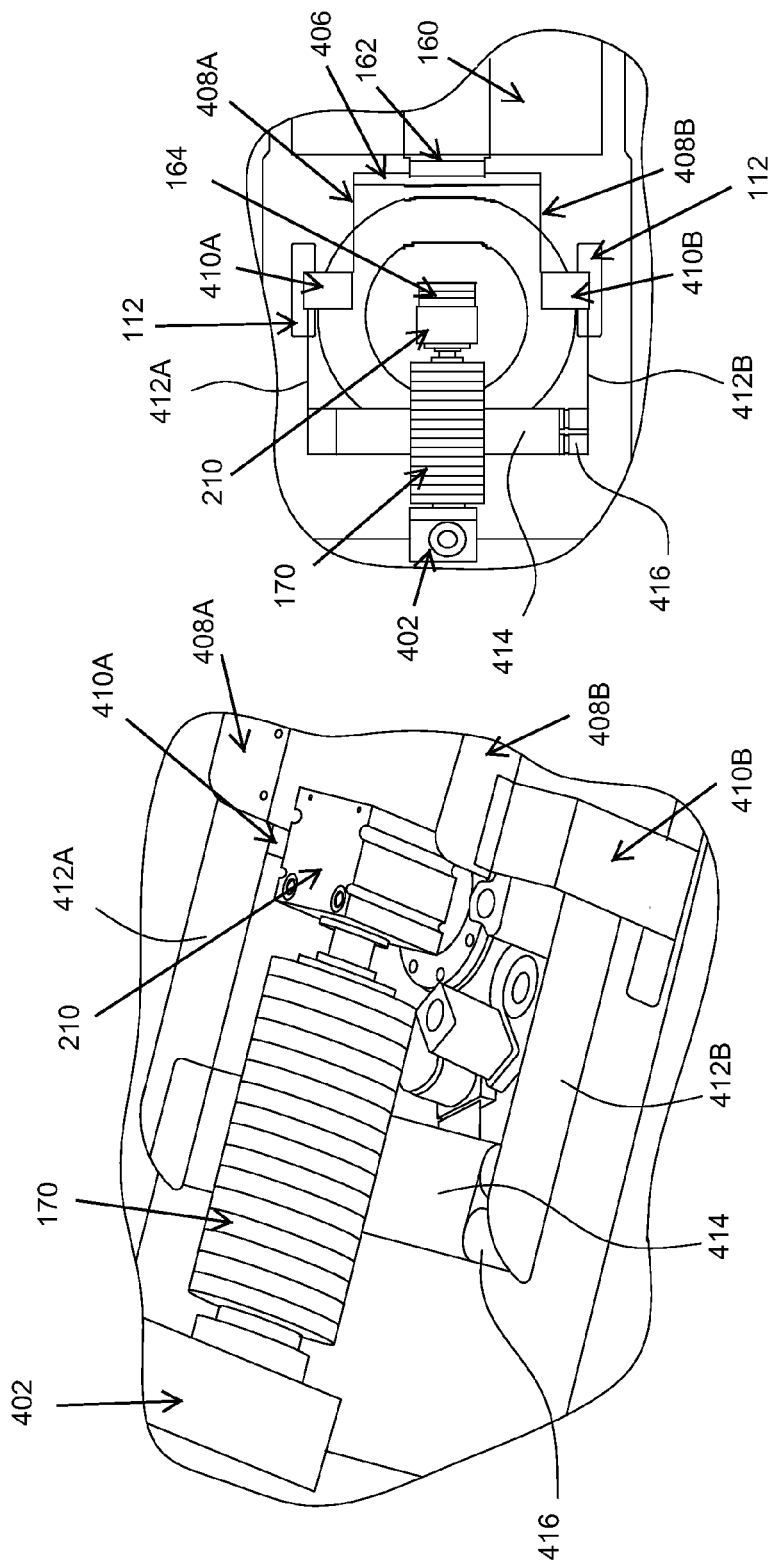

BALANCING RF BRIDGE ASSEMBLY

CROSS-REFERENCE TO RELATED APPLICATIONS

This application claims benefit of U.S. Provisional Patent Application Ser. No. 61/298,394, filed Jan. 26, 2010, which is herein incorporated by reference.

BACKGROUND OF THE INVENTION

1. Field of the Invention

Embodiments disclosed herein generally relate to a plasma enhanced chemical vapor deposition (PECVD) apparatus.

2. Description of the Related Art

PECVD is a process whereby a gas is introduced into an apparatus, the gas is ignited into a plasma and a material layer is deposited onto a substrate. There are many applications for utilizing a PECVD process such as to deposit layers for a flat panel display (FPD), to deposit layers for a solar panel and to deposit layers for an organic light emitting display (OLED) to name a few.

For FPD applications in particular, the PECVD chamber size has increased over the years to accommodate the consumer demand for larger FPDs. As the chamber size has increased, so has the power applied to generate the plasma. These larger chambers encounter numerous problems that smaller chambers, typically used to process semiconductor substrates, may experience such as RF grounding and plasma distribution to name only a few. However, the magnitude of the problems for large chambers is significantly greater than for smaller chambers, and the solutions to the problems are not necessarily the same for small chambers and large chambers.

One of the problems faced by large area processing chambers is the effect of slit valve openings. The slit valve opening through one of the chamber walls affects the RF return path and may lead to plasma asymmetry within the processing chamber. As the slit valve opening becomes larger to accommodate even larger substrates, the asymmetry can increase. The asymmetry affects the film thickness and the film properties.

FIG. 1 is a cross sectional view of a prior art large area PECVD apparatus. The apparatus includes a chamber 100 in which one or more films may be deposited onto a substrate 120. The chamber 100 generally includes walls 102, a bottom 104, a showerhead 106, and substrate support 118 which define a process volume. The process volume is accessed through a slit valve opening 108 such that the substrate 120 may be transferred in and out of the chamber 100. The substrate support 118 may be coupled to an actuator 116 to raise and lower the substrate support 118. Lift pins 122 are moveably disposed through the substrate support 118 to move a substrate to and from the substrate receiving surface. The substrate support 118 may also include heating and/or cooling elements 124 to maintain the substrate support 118 at a desired temperature. The substrate support 118 may also include RF return straps 126 to provide an RF return path at the periphery of the substrate support 118.

The showerhead 106 is coupled to a backing plate 112 by a fastening mechanism 150. The showerhead 106 and the backing plate 112, because they are coupled to the RF power source 128 are considered to be electrodes. The showerhead 106 may be coupled to the backing plate 112 by one or more fastening mechanisms 150 to help prevent sag and/or control the straightness/curvature of the showerhead 106. In one embodiment, twelve fastening mechanisms 150 may be used to couple the showerhead 106 to the backing plate 112. The fastening mechanisms 150 may include a nut and bolt assembly.

A gas source 132 is coupled to the backing plate 112 to provide gas through gas passages in the showerhead 106 to the substrate 120. A vacuum pump 110 is coupled to the chamber 100 to control the process volume 106 at a desired pressure. A RF power source 128 is coupled to the backing plate 112 and/or to the showerhead 106 to provide a RF current to the showerhead 106. The RF current creates an electric field between the showerhead 106 and the substrate support 118 so that a plasma may be generated from the gases between the showerhead 106 and the substrate support 118. Various frequencies may be used, such as a frequency between about 0.3 MHz and about 200 MHz. In one embodiment, the RF current is provided at a frequency of 13.56 MHz. The RF current is supplied to the chamber 100 through a match network 160. The match network 160 is coupled to the gas feed through 170 by an electrically conductive strap 162 and a connection plate 164. The RF current travels from the match network 160 along a path shown by arrows 166 and returns along the path shown by arrows 168.

A remote plasma source 130, such as an inductively coupled remote plasma source 130, may also be coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The processing gas or remotely generated radicals travel through a gas feed through 170 before entering the area between the backing plate 112 and the showerhead 106.

The backing plate 112 may be supported by a support assembly 138. One or more anchor bolts 140 may extend down from the support assembly 138 to a support ring 144. The support ring 144 may be coupled with the backing plate 112 by one or more fastening mechanisms 142. In one embodiment, the fastening mechanisms 142 may comprise a nut and bolt assembly. The support ring 144 may be coupled with the backing plate 112 substantially in the center of the backing plate 112. The center of the backing plate 112 is the area of the backing plate 112 with the least amount of support in absence of the support ring 144. Therefore, supporting the center area of the backing plate 112 may reduce and/or prevent sagging of the backing plate 112.

The showerhead 106 may be coupled to the backing plate 112 by a bracket 134. The bracket 134 may have a ledge 136 upon which the showerhead 106 may rest. The backing plate 112 may rest on a ledge 114 coupled with the chamber walls 102 to seal the chamber 100. A chamber lid 152 may be coupled with the chamber walls 102 and spaced from the backing plate 112 by area 154. The chamber lid 152 may have an opening therethrough to permit the one or more fastening mechanisms 142 to couple with the backing plate 112 and the gas feed conduit 156 to supply processing gas to the chamber 100.

An RF return plate 146 may be coupled with the ring 144 and the chamber lid 152. The RF return plate 146 may be coupled with the chamber lid 152 by a fastening mechanism 148. The RF return plate 146 may be coupled between the fastening mechanism 142 and the ring 144. The RF return plate 146 provides a path for the RF current to flow back down to the chamber lid 152 and then to the RF power source 128.

FIG. 2 is a schematic isometric view of a prior art center feed RF coupling. As shown in FIG. 2, it is quite crowded in the center area. FIG. 2 shows the matching network 160 coupled to an end block 210. The electrically conductive strap 162 is coupled to the match network 160 and the connection plate 164 is coupled to the end block 210. Gas is fed to the chamber from a gas source through the gas feed through 170 into the end block 210 and into the chamber. The end block 210 is surrounded by the support ring 144 that couples the backing plate to the support structure.

As discussed above, the processing chamber 100 may have an asymmetry due to the slit valve that causes an asymmetry in film thickness and properties. By moving RF feed location from the center, the asymmetry may be controlled. The location may be moved closer to the slit valve opening and thus, counteract the slit valve opening.

Another manner of cancelling the slit valve opening effect on the plasma is to utilize multiple feeding points for the RF power to couple to the electrode. However, multiple feeding points may lead to reliability problems even with a small variation in the configuration. For example, the impedance of both feeding extensions in a dual feeding system can be changed easily by stray capacitance to the grounding wall. The stray capacitance will cause current change and affect the process results. Another possibility is that capacitors installed in the middle of the RF feeding strap could be different within manufacture's error range. In other words, the process is not consistent even with a small variation from chamber to chamber. Thus, a single feed has typically been used because it provides greater consistency as opposed to a multiple feed that will have an unbalanced current.

The sensitivity of the film profile by the feeding location is a function of the chamber size and the process gases among other things. Therefore, the feeding point is usually different based on the chamber configuration and process. In other words, some cases utilize a feeding point that is very close to the center of the electrode while others utilize a feeding point quite far from the center. Thus, even though a single feed location closer to the slit valve opening may be used to counteract the effects of the slit valve opening, there are situations where there is a competing interest in maintaining the single feed location as close to the center of the electrode as possible. A single feed location that is closer to the slit valve opening and also at the substantial center of the electrode is not possible. A multiple feed option is attractive; however, the multiple feed could be inconsistent as discussed above.

Therefore, there is a need in the art for a PECVD apparatus that has multiple locations where the RF power source couples to the electrode and decreases plasma asymmetry.

SUMMARY OF THE INVENTION

Embodiments disclosed herein generally relate to an RF bridge assembly used in a PECVD apparatus. In order to ensure that both the current and voltage are substantially identical at multiple locations where the RF power is delivered to the backing plate, an RF bridge assembly may be coupled between the multiple locations at a location just before connection to the backing plate. The RF bridge assembly substantially equalizes the voltage distribution and current distribution between the multiple locations. Therefore, a substantially identical current and voltage is applied to the backing plate at the multiple locations.

In one embodiment, an apparatus is disclosed. The apparatus includes a processing chamber having a backing plate having a first electrical connection and a second electrical connection separate from the first electrical connection. The apparatus also includes an RF power source and a match network coupled to the RF power source. The apparatus also includes a first electrically conductive component having a first end coupled to the match network, a second end coupled to one or more first brackets that are coupled to the first electrical connection. The first electrically conductive component also has a third end that is coupled to one or more second brackets that are coupled to the second electrical connection. The apparatus also includes an RF bridge assembly having one or more discrete elements coupled between the first electrical connection and the second electrical connection at a location spaced from the backing plate.

In another embodiment, an apparatus is disclosed. The apparatus includes a processing chamber having a backing plate and a support structure disposed outside of the processing chamber above the backing plate. The support structure is coupled to the backing plate at a substantial center thereof. The apparatus also includes a power source and a matching network coupled to the power source. The apparatus also includes an electrically conductive strap coupled to the matching network, a first bracket coupled to the electrically conductive strap, a second bracket coupled to the first bracket, a third bracket coupled to the first bracket, a fourth bracket coupled to the second bracket and the backing plate, a fifth bracket coupled to the third bracket and the backing plate, and an RF bridge assembly coupled between the fourth and fifth brackets. The RF bridge assembly has one or more discrete elements.

In another embodiment, a plasma enhanced chemical vapor deposition apparatus is disclosed. The apparatus includes a processing chamber and a backing plate disposed in the processing chamber. The backing plate has a first electrical coupling disposed adjacent the substantial center of the backing plate and a second electrical coupling disposed adjacent the substantial center of the backing plate. The second electrical coupling is separate from the first electrical coupling. The apparatus also includes a support ring coupled to the backing plate around the substantial center of the backing plate, a lid disposed above the backing plate and a support structure coupled through the lid to the support ring. The apparatus also includes an RF power source and a matching network disposed on the lid and coupled to the RF power source. The apparatus also includes a gas feed through coupled to the backing plate at the substantial center of the backing plate, the gas feed through extending through the support ring and a first electrically conductive member having a first end, a second end and a third end, the first end coupled to the matching network. The apparatus also includes one or more first brackets coupled between the first electrical coupling and the matching network, one or more second brackets coupled between the second electrical coupling and the matching network, and an RF bridge assembly coupled between the one or more first brackets and the one or more second brackets. The RF bridge assembly has one or more discrete elements.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A-4D are schematic views of the RF feed coupling to the chamber where an RF bridge assembly is used to balance the voltage according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein generally relate to an RF bridge assembly used in a PECVD apparatus. In order to ensure that both the current and voltage are substantially identical at multiple locations where the RF power is delivered to the backing plate, an RF bridge assembly may be coupled between the multiple locations at a location just before connection to the backing plate. The RF bridge assembly substantially equalizes the voltage distribution and current distribution between the multiple locations. Therefore, a substantially identical current and voltage is applied to the backing plate at the multiple locations.

One suitable PECVD apparatus which may be used is available from AKT America, Inc., a subsidiary of Applied Materials, Inc., located in Santa Clara, Calif. While the description below will be made in reference to a PECVD apparatus, it is to be understood that the invention is equally applicable to other processing chambers as well, including those made by other manufacturers.

Figure 1:
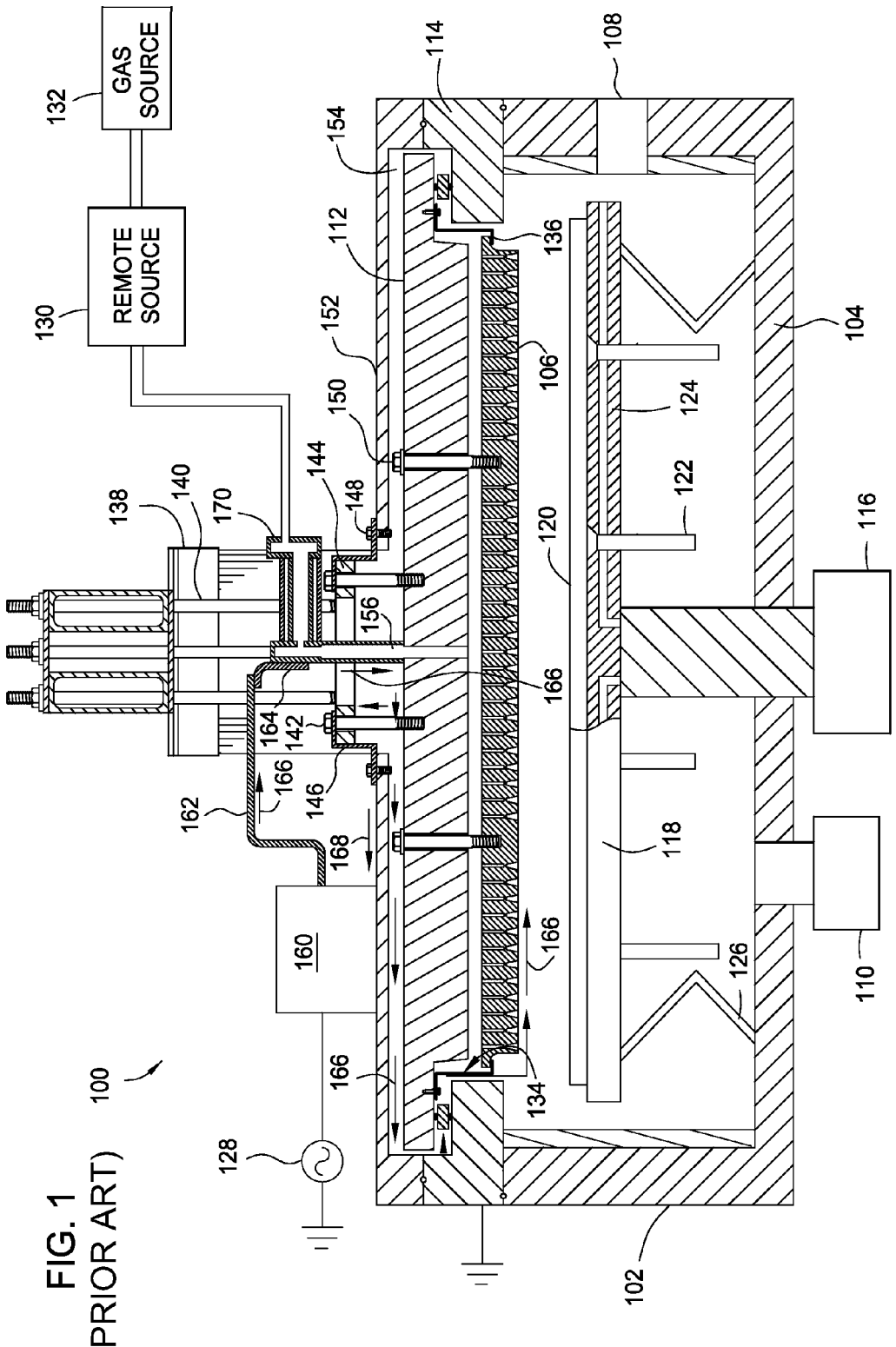
FIG. 1 is a cross sectional view of a prior art PECVD apparatus.
Figure 2:
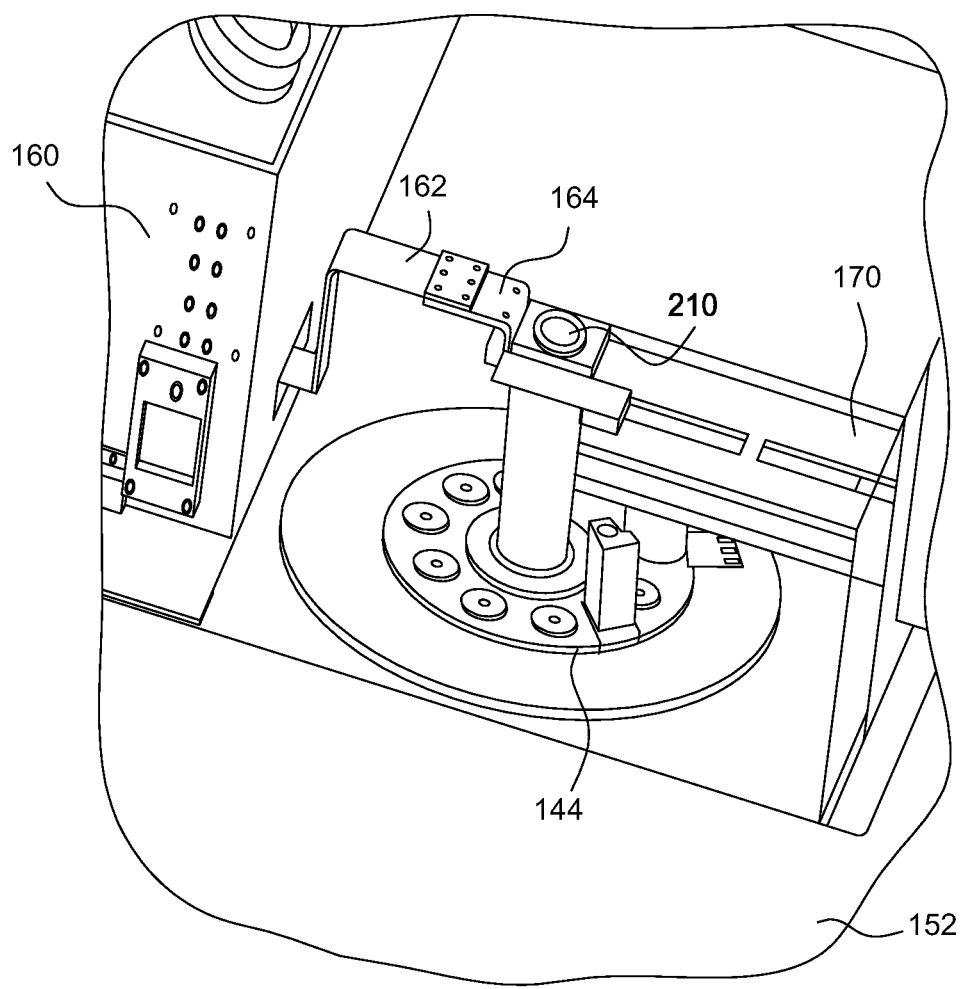
FIG. 2 is a schematic isometric view of a prior art center feed RF coupling that may be utilized on the PECVD apparatus of FIG. 1.
Figure 3:
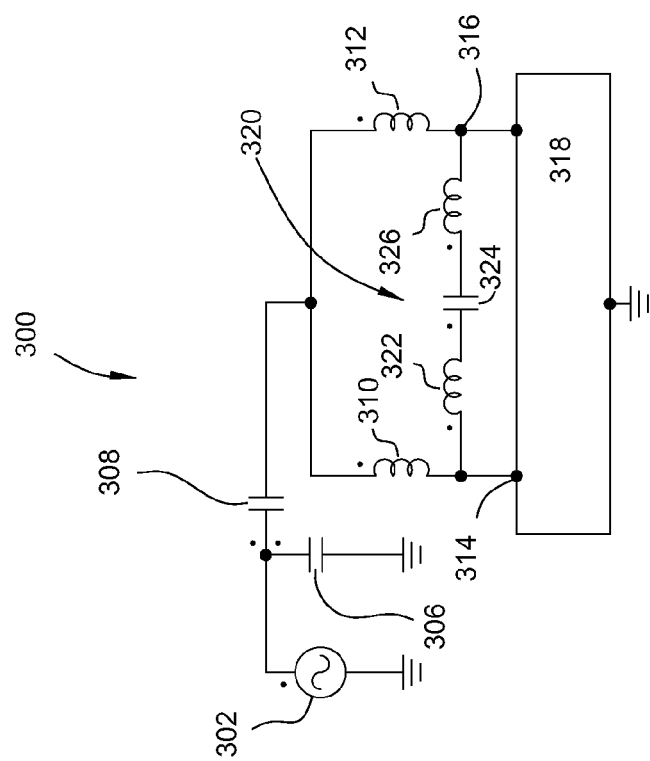
FIG. 3 is a schematic view of an electrical layout of a dual RF feed coupling to an electrode where an RF bridge assembly is used according to one embodiment.
Figure 4A:
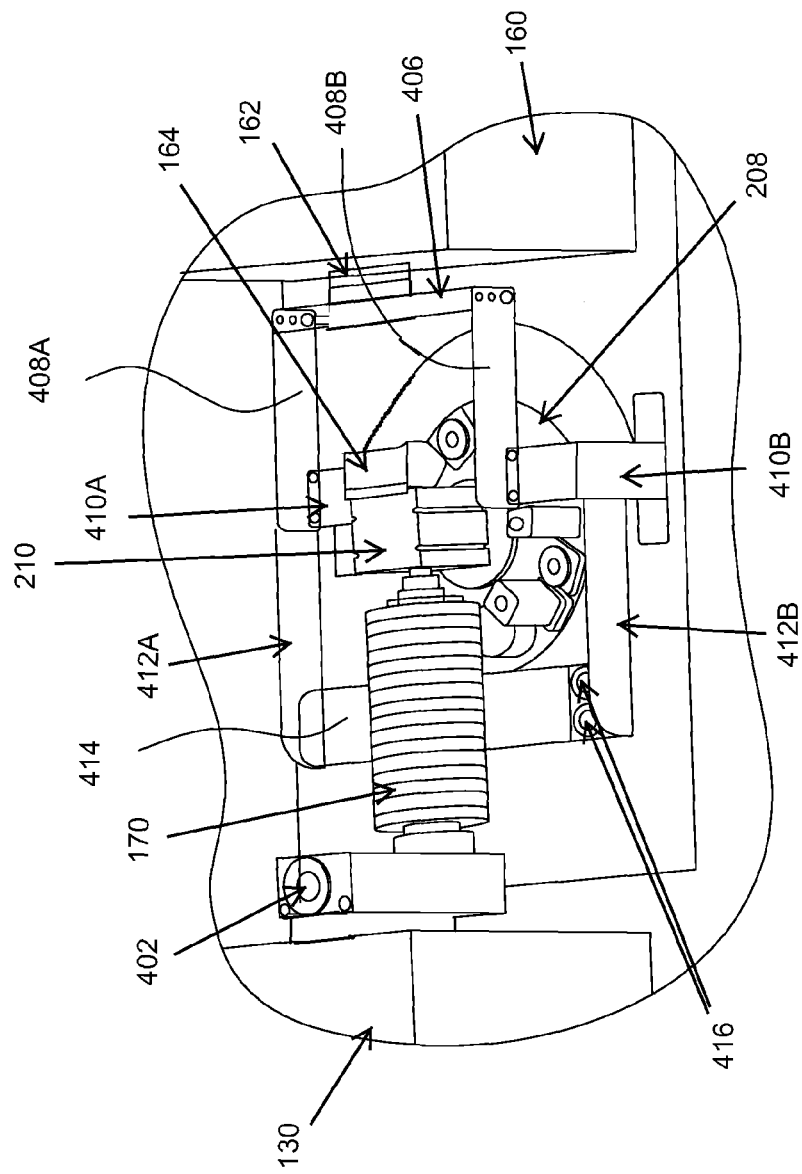
Figure 4D:
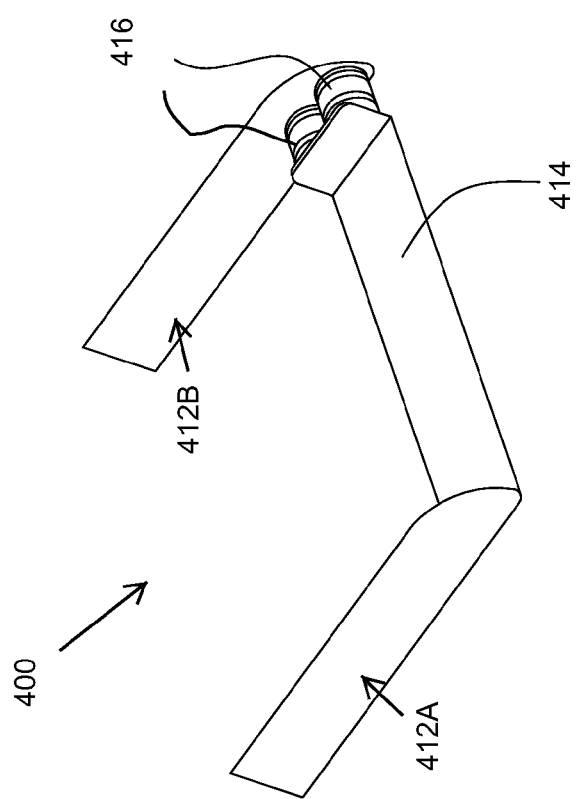

FIG. 3 is a schematic view of an electrical layout 300 of a dual RF feed coupling to an electrode 318 where an RF bridge assembly 320 is used to ensure substantially the same voltage is applied at two separate points 314, 316. The RF power source 302 is coupled to a match network. The match network has at least two capacitors 306, 308 therein. The match network is then split to couple to the electrode 318. There is an inductance, shown by inductors 310, 312 between the match network and the electrode 318 due to the length of the connection. The RF power is then coupled to the electrode 318 at two separate points 314, 316. It is to be understood that while two connection points 314, 316 have been shown, numerous connection points may be utilized. Prior to connecting to the electrode 318, the split RF feed is coupled together by the RF bridge assembly 320 that electrically couples the two lines together. The RF bridge assembly 320 is represented by inductors 322, 326 and one or more capacitors 324. The RF bridge assembly 320 functions to balance the RF power between the two feed points 314, 316 such that the RF power at the two feed points 314, 316 is substantially identical.

For example, in absence of the RF bridge assembly 320, the voltage at point 314 may be greater than the voltage at point 316. With the RF bridge assembly 320, the excess current that normally would flow to point 314 will flow to point 316 to evenly distribute the voltage. The current is equal to the difference in voltage divided by the impedance of the RF bridge assembly 320. Therefore, a capacitive coupling (such as capacitor 324) in the middle of the RF bridge assembly 320 creates a resonant circuit because an electrical connection has inductance by itself and impedes the current. In other words, impedance should be zero or very small to allow enough current for equalizing the voltage between two different points 314, 316. Accordingly, the RF bridge assembly 320 will increase the voltage and current at point 316. The current will continue to flow and the RF bridge assembly 320 will compensate for the voltage difference between two points.

FIGS. 4A-4D are schematic views of the RF feed coupling to the chamber 100 where an RF bridge assembly 400 is used to balance the voltage. The gas is delivered through the gas feed through 170 through an end block 402. In FIGS. 4A-4D, the RF current is initially fed from the match box 160 through electrically conductive strap 162 to a first bracket 406. The first bracket 406 comprises an electrically conductive material. The first bracket 406 has two ends to enable the current to ultimately flow to two different locations. A second bracket 408A is coupled to the first end of the first bracket 406, and a third bracket 408B is coupled to the second end of the first bracket 406. Both the second bracket 408A and the third bracket 408B comprise an electrically conductive material. RF current travels along both the second bracket 408A and the third bracket 408B from the first bracket 406. A fourth bracket 410A is coupled to the second bracket 408A, and a fifth bracket 410A is coupled to the third bracket 408B. Both the fourth bracket 410A and the fifth bracket 410B comprise an electrically conductive material. RF current travels along both the fourth bracket 410A and the fifth bracket 410B. Both the fourth bracket 410A and the fifth bracket 410B are coupled to the backing plate 112 to deliver the RF current to the backing plate 112.

The RF bridge assembly 400 couples the fourth and fifth brackets 410A, 410B together at a location that is close to the backing plate 112. The RF bridge assembly 400 includes a sixth bracket 412A that is coupled to the fourth bracket 410A. The RF bridge assembly 400 also includes a seventh bracket 412B that is coupled to the fifth bracket 410A. The sixth and seventh brackets 412A, 412B are coupled together by an eighth bracket 414. The sixth, seventh and eighth brackets 412A, 412B, 414 each comprise an electrically conductive material. One or more discrete elements 416 are coupled between the eighth bracket 414 and the seventh bracket 412B. It is to be understood that the discrete elements 416 may be coupled between the eighth bracket 414 and the sixth bracket 412A or at any location along the RF bridge assembly 400 between the fourth and fifth brackets 410A, 410B. In one embodiment, the discrete elements 416 may comprise resonance capacitors. In one embodiment, a single capacitor is present. In another embodiment, a plurality of capacitors are present. In one embodiment, the plurality of capacitors comprise at least one capacitor that has a different capacity than another capacitor of the plurality of capacitors. In one embodiment, the plurality of capacitors have the same capacity.

It is important to note the location of the RF bridge assembly 400. The RF bridge assembly 400 is disposed at a location that is closer to the backing plate 112 then to the match network 160. Additionally, the RF bridge assembly 400 is disposed just before where the RF current couples to the electrode. The RF bridge assembly 400 is an electrical resonant connection. The RF bridge assembly 400 functions to evenly distribute the power between the electrical connections so that substantially the same voltage and current is delivered to the backing plate at all RF feed locations. For example, if the voltage and current at one electrical connection is greater than the voltage and current at the other electrical connection, the voltage will evenly distribute using the bridge so that at the location where the electrical connections couple to the backing plate, the current and voltage in final feeding locations are substantially identical. Thus, multiple feeds may be used that are spaced from the substantial center of the electrode. In absence of the RF bridge assembly 400, the current and voltage imbalance may lead to an unbalanced plasma profile in the chamber 100.

The RF bridge assembly 400 is connected to the multiple feeding points at a location just before the final RF feeding connection to the electrode. The RF bridge assembly may comprise a metal wire or plate or other electrical connection together with capacitive elements. The closer to the final feeding location the RF bridge assembly 400 is located, the better the effect it will have for minimizing the difference between the multiple feeds because it will compensate for all current and voltage differences just before the RF bridge assembly 400. Accordingly, in a PECVD chamber, the RF bridge assembly 400 should be close to the backing plate 112. Even when the current and voltage is different between multiple points, the RF bridge assembly 400 always compensates for the difference by adding more current to the lower voltage point. Accordingly, the voltage and current difference can be minimized at two or more points. It is to be understood that while two connection points to the backing plate have been discussed, additional connection points to the backing plate are contemplated.

There are numerous advantages to utilizing an RF bridge assembly between multiple RF feed locations. One advantage is that the voltage and current may be substantially identical at the multiple feed locations. By utilizing the RF bridge assembly, it is possible to compensate for current unbalance which can be caused by off-center split RF feeding for canceling the slit valve effect by disposing the RF feed locations closer to the slit valve opening and spaced from the center. Additionally, the RF bridge assembly makes it possible to provide the electrical connection as close to the center of the electrode as possible while ensuring the voltage and current at the multiple locations that are close to the center of the electrode are substantially identical.

While the foregoing is directed to embodiments of the present invention, other and further embodiments of the invention may be devised without departing from the basic scope thereof, and the scope thereof is determined by the claims that follow.

The invention claimed is:

1. An apparatus, comprising:
   a processing chamber having a backing plate having a first electrical connection and a second electrical connection separate from the first electrical connection;
   an RF power source;
   a match network coupled to the RF power source;
   a first electrically conductive component having a first end coupled to the match network, a second end coupled to one or more first brackets that are coupled to the first electrical connection, and a third end coupled to one or more second brackets that are coupled to the second electrical connection; and
   an RF bridge assembly having at least one tuning capacitor coupled between the first electrical connection and the second electrical connection at a location spaced from the backing plate.

2. The apparatus of claim 1, wherein both the first electrical connection and the second electrical connection are spaced from a center of the backing plate.

3. The apparatus of claim 2, wherein a gas source is coupled to the processing chamber at a location spaced from the first and second electrical connections.

4. The apparatus of claim 3, wherein the apparatus is a plasma enhanced chemical vapor deposition apparatus.

5. The apparatus of claim 4, wherein the at least one tuning capacitor comprises a plurality of tuning capacitors and at least one tuning capacitor has a different capacity than another tuning capacitor of the plurality of tuning capacitors.

6. The apparatus of claim 1, wherein the apparatus is a plasma enhanced chemical vapor deposition apparatus.

7. The apparatus of claim 1, wherein the processing chamber has a generally rectangular shape.

8. An apparatus, comprising:
   a processing chamber having a backing plate;
   a support structure disposed outside of the processing chamber above the backing plate, the support structure coupled to the backing plate at a substantial center thereof;
   a power source;
   a matching network coupled to the power source;
   an electrically conductive strap coupled to the matching network;
   a first bracket coupled to the electrically conductive strap;
   a second bracket coupled to a first end of the first bracket;
   a third bracket coupled to a second end of the first bracket;
   a fourth bracket coupled to the second bracket and to the backing plate;
   a fifth bracket coupled to the third bracket and to the backing plate; and
   an RF bridge assembly coupled between the fourth and fifth brackets, the RF bridge assembly having at least one tuning capacitor.

9. The apparatus of claim 8, wherein the RF bridge assembly comprises:
   a sixth bracket coupled to the fourth bracket;
   a seventh bracket coupled to the fifth bracket;
   an eighth bracket coupled between the sixth and seventh brackets; and
   the at least one tuning capacitor.

10. The apparatus of claim 9, wherein a gas source is coupled to the processing chamber at a location spaced from the first coupling location and the second coupling location.

11. The apparatus of claim 8, wherein the apparatus is a plasma enhanced chemical vapor deposition apparatus.

12. The apparatus of claim 8, wherein the processing chamber has a generally rectangular shape.

13. A plasma enhanced chemical vapor deposition apparatus, comprising:
   a processing chamber;
   a backing plate disposed in the processing chamber, the backing plate having a first electrical coupling disposed adjacent the substantial center of the backing plate and a second electrical coupling disposed adjacent the substantial center of the backing plate, the second electrical coupling separate from the first electrical coupling;
   a support ring coupled to the backing plate around the substantial center of the backing plate;
   a lid disposed above the backing plate;
   a support structure coupled through the lid to the support ring;
   an RF power source;
   a matching network disposed on the lid and coupled to the RF power source;
   a gas feed through coupled to the backing plate at the substantial center of the backing plate, the gas feed through extending through the support ring;
   one or more first brackets coupled between the first electrical coupling and the matching network;
   one or more second brackets coupled between the second electrical coupling and the matching network; and an RF bridge assembly coupled between the one or more first brackets and the one or more second brackets, the RF bridge assembly having at least one tuning capacitor.

14. The apparatus of claim 13, wherein the at least one tuning capacitor comprises a plurality of tuning capacitors and at least one tuning capacitor has a different capacity than another tuning capacitor of the plurality of tuning capacitors.

15. The apparatus of claim 14, wherein the processing chamber has a generally rectangular shape.

16. The apparatus of claim 13, wherein the at least one tuning capacitor comprises a plurality of tuning capacitors and at least one tuning capacitor has a different capacity than another tuning capacitor of the plurality of tuning capacitors.

17. The apparatus of claim 16, wherein the processing chamber has a generally rectangular shape.

* * * * *